US008811917B2

(12) United States Patent
Kim et al.

(10) Patent No.: US 8,811,917 B2
(45) Date of Patent: Aug. 19, 2014

(54) DIGITAL HYBRID MODE POWER AMPLIFIER SYSTEM

(75) Inventors: Wan Jong Kim, Coquitlam (CA);
Kyoung Joon Cho, Coquitlam (CA);
Shawn Patrick Stapleton, Burnaby (CA); Jong Heon Kim, Seoul (KR);
Dali Yang, Mountain View, CA (US)

(73) Assignee: Dali Systems Co. Ltd., George Town, Grand Cayman (KY)

( * ) Notice: Subject to any disclaimer, the term of this patent is extended or adjusted under 35 U.S.C. 154(b) by 0 days.

(21) Appl. No.: 12/108,502

(22) Filed: Apr. 23, 2008

(65) Prior Publication Data

US 2008/0268795 A1 Oct. 30, 2008

Related U.S. Application Data

(63) Continuation-in-part of application No. 12/021,241, filed on Jan. 28, 2008, which is a continuation-in-part of application No. 11/799,239, filed on Apr. 30, 2007, which is a continuation-in-part of application No. 11/262,079, filed on Oct. 27, 2005, which is a continuation of application No. 10/137,556, filed on May 1, 2002, now Pat. No. 6,985,704.

(60) Provisional application No. 60/925,603, filed on Apr. 23, 2007, provisional application No. 61/041,164, filed on Mar. 31, 2008, provisional application No. 61/012,416, filed on Dec. 7, 2007, provisional application No. 60/925,577, filed on Apr. 23, 2007, provisional application No. 60/969,127, filed on Aug. 30, 2007, provisional application No. 60/969,131, filed on Aug. 30, 2007.

(51) Int. Cl.
*H04B 1/04* (2006.01)

(52) U.S. Cl.
USPC ..................................... 455/114.3

(58) Field of Classification Search
CPC .... H04L 27/368; H04W 88/08; H04W 36/06; H04B 1/0475; H04B 1/62; H03F 1/3247
USPC ........ 455/424, 425, 456.5, 456.6, 561, 550.1, 455/575.1, 63.1, 67.13, 114.3, 114.2, 127.3, 455/127.1, 69, 126; 330/129, 149, 266, 330/265, 267, 271, 272, 289; 375/296, 297
See application file for complete search history.

(56) References Cited

U.S. PATENT DOCUMENTS

| 4,638,248 A | 1/1987 | Schweickert |
| 4,700,151 A | 10/1987 | Nagata |

(Continued)

FOREIGN PATENT DOCUMENTS

| CN | 1462153 A | 12/2003 |
| CN | 1518209 A | 8/2004 |

(Continued)

OTHER PUBLICATIONS

Stapleton and Flaviu, Title: an adaptive predistorter for power amplifier based on adjacent channel emissions, pp. 49-56, IEEE 0018-9548/92, IEEE transactions on vehicular technology, vol. 41, No. 1, Feb. 1992.*

(Continued)

*Primary Examiner* — Ankur Jain
(74) *Attorney, Agent, or Firm* — Kilpatrick Townsend & Stockton LLP

(57) ABSTRACT

A RF-digital hybrid mode power amplifier system for achieving high efficiency and high linearity in wideband communication systems is disclosed. The present invention is based on the method of adaptive digital predistortion to linearize a power amplifier in the RF domain. The power amplifier characteristics such as variation of linearity and asymmetric distortion of the amplifier output signal are monitored by the narrowband feedback path and controlled by the adaptation algorithm in a digital module. Therefore, the present invention could compensate the nonlinearities as well as memory effects of the power amplifier systems and also improve performances, in terms of power added efficiency, adjacent channel leakage ratio and peak-to-average power ratio. The present disclosure enables a power amplifier system to be field reconfigurable and support multi-modulation schemes (modulation agnostic), multi-carriers and multi-channels. As a result, the digital hybrid mode power amplifier system is particularly suitable for wireless transmission systems, such as base-stations, repeaters, and indoor signal coverage systems, where baseband I-Q signal information is not readily available.

21 Claims, 10 Drawing Sheets

(56) References Cited

U.S. PATENT DOCUMENTS

| | | | |
|---|---|---|---|
| 4,890,300 A | 12/1989 | Andrews | |
| 4,929,906 A | 5/1990 | Voyce et al. | |
| 5,049,832 A * | 9/1991 | Cavers | 330/149 |
| 5,121,412 A | 6/1992 | Borth | |
| 5,132,639 A | 7/1992 | Blauvelt et al. | |
| 5,396,190 A * | 3/1995 | Murata | 330/149 |
| 5,486,789 A | 1/1996 | Palandech et al. | |
| 5,579,342 A * | 11/1996 | Crozier | 375/296 |
| 5,675,287 A | 10/1997 | Baker et al. | 330/129 |
| 5,678,198 A * | 10/1997 | Lemson | 455/67.11 |
| 5,732,333 A * | 3/1998 | Cox et al. | 455/126 |
| 5,757,229 A | 5/1998 | Mitzlaff | |
| 5,786,728 A | 7/1998 | Alinikula | |
| 5,920,808 A | 7/1999 | Jones et al. | |
| 5,936,464 A * | 8/1999 | Grondahl | 330/10 |
| 5,937,011 A * | 8/1999 | Carney et al. | 375/297 |
| 5,949,283 A | 9/1999 | Proctor et al. | |
| 5,959,499 A | 9/1999 | Khan et al. | |
| 5,963,549 A | 10/1999 | Perkins et al. | |
| 6,054,896 A * | 4/2000 | Wright et al. | 330/149 |
| 6,055,418 A | 4/2000 | Harris et al. | |
| 6,091,941 A * | 7/2000 | Moriyama et al. | 455/126 |
| 6,141,390 A | 10/2000 | Cova | |
| 6,166,601 A * | 12/2000 | Shalom et al. | 330/151 |
| 6,240,144 B1 | 5/2001 | Ha | |
| 6,242,979 B1 | 6/2001 | Li | |
| 6,246,286 B1 | 6/2001 | Persson | |
| 6,246,865 B1 | 6/2001 | Lee | |
| 6,275,685 B1 | 8/2001 | Wessel et al. | |
| 6,301,579 B1 | 10/2001 | Becker | |
| 6,315,189 B1 | 11/2001 | Williams | |
| 6,400,774 B1 | 6/2002 | Matsuoka et al. | |
| 6,424,225 B1 * | 7/2002 | Choi et al. | 330/289 |
| 6,430,402 B1 | 8/2002 | Agahi-Kesheh | |
| 6,512,417 B2 | 1/2003 | Booth et al. | |
| 6,552,609 B2 | 4/2003 | Hamada et al. | |
| 6,552,634 B1 * | 4/2003 | Raab | 333/216 |
| 6,566,944 B1 | 5/2003 | Pehlke et al. | |
| 6,625,429 B1 | 9/2003 | Yamashita | |
| 6,639,050 B1 | 10/2003 | Kieliszewski | |
| 6,639,463 B1 | 10/2003 | Ghanadan et al. | |
| 6,639,466 B2 | 10/2003 | Johnson | |
| 6,677,870 B2 * | 1/2004 | Im et al. | 341/110 |
| 6,697,436 B1 * | 2/2004 | Wright et al. | 375/296 |
| 6,703,897 B2 * | 3/2004 | O'Flaherty et al. | 330/149 |
| 6,741,663 B1 | 5/2004 | Tapio et al. | |
| 6,747,649 B1 | 6/2004 | San-z Pastor et al. | |
| 6,751,447 B1 * | 6/2004 | Jin et al. | 455/114.3 |
| 6,794,931 B2 | 9/2004 | Kenington | |
| 6,963,242 B2 | 11/2005 | White et al. | |
| 6,983,025 B2 * | 1/2006 | Schell | 375/296 |
| 6,985,704 B2 * | 1/2006 | Yang et al. | 455/126 |
| 7,031,749 B1 | 4/2006 | Mitama | |
| 7,035,345 B2 * | 4/2006 | Jeckeln et al. | 375/296 |
| 7,042,287 B2 * | 5/2006 | Robinson | 330/149 |
| 7,061,314 B2 | 6/2006 | Kwon et al. | |
| 7,064,606 B2 | 6/2006 | Louis | |
| 7,068,984 B2 | 6/2006 | Mathe et al. | |
| 7,079,818 B2 | 7/2006 | Khorram | |
| 7,102,442 B2 | 9/2006 | Anderson | |
| 7,103,329 B1 * | 9/2006 | Thon | 455/126 |
| 7,104,310 B2 * | 9/2006 | Hunter | 164/456 |
| 7,106,806 B1 | 9/2006 | Kenington | |
| 7,109,792 B2 * | 9/2006 | Leffel | 330/149 |
| 7,109,998 B2 | 9/2006 | Smith | |
| 7,151,913 B2 | 12/2006 | Ahmed | |
| 7,158,765 B2 * | 1/2007 | Blair et al. | 455/127.1 |
| 7,193,471 B2 | 3/2007 | Tsutsui et al. | |
| 7,193,472 B2 | 3/2007 | Gotou et al. | |
| 7,248,642 B1 | 7/2007 | Vella-Coleiro | |
| 7,259,630 B2 | 8/2007 | Bachman et al. | |
| 7,301,402 B2 | 11/2007 | Norris et al. | |
| 7,321,635 B2 | 1/2008 | Ocenasek et al. | |
| 7,321,636 B2 | 1/2008 | Harel et al. | |
| 7,372,918 B2 | 5/2008 | Muller et al. | |
| 7,409,007 B1 | 8/2008 | Johnson et al. | |
| 7,469,491 B2 * | 12/2008 | McCallister et al. | 375/296 |
| 7,493,094 B2 | 2/2009 | Ichitsubo et al. | |
| 7,593,710 B2 | 9/2009 | Brigaud et al. | |
| 7,702,300 B1 | 4/2010 | McCune | |
| 7,826,810 B2 | 11/2010 | Carmel et al. | |
| 7,831,221 B2 | 11/2010 | Leffel et al. | |
| RE42,287 E | 4/2011 | Apodaca et al. | |
| 8,213,884 B2 | 7/2012 | Kim et al. | |
| 8,401,499 B2 | 3/2013 | Kim et al. | |
| 8,509,347 B2 | 8/2013 | Kim et al. | |
| 8,548,403 B2 | 10/2013 | Kim et al. | |
| 2002/0034260 A1 | 3/2002 | Kim | |
| 2002/0044014 A1 | 4/2002 | Wright et al. | |
| 2002/0080891 A1 | 6/2002 | Ahn et al. | |
| 2002/0097085 A1 | 7/2002 | Stapleton | |
| 2002/0101937 A1 | 8/2002 | Antonio et al. | |
| 2002/0101938 A1 * | 8/2002 | Horaguchi et al. | 375/297 |
| 2002/0158689 A1 | 10/2002 | Harris et al. | |
| 2002/0179830 A1 | 12/2002 | Opas et al. | |
| 2002/0187761 A1 | 12/2002 | Im et al. | |
| 2002/0193085 A1 * | 12/2002 | Mathe et al. | 455/126 |
| 2003/0095608 A1 * | 5/2003 | Duperray | 375/297 |
| 2003/0179829 A1 * | 9/2003 | Pinckley et al. | 375/295 |
| 2003/0179830 A1 | 9/2003 | Eidson et al. | |
| 2003/0207680 A1 | 11/2003 | Yang et al. | |
| 2003/0234688 A1 | 12/2003 | Matsuyoshi et al. | |
| 2004/0017859 A1 | 1/2004 | Sills et al. | |
| 2004/0032912 A1 | 2/2004 | Ocenasek et al. | |
| 2004/0105509 A1 | 6/2004 | McGowan et al. | |
| 2004/0212428 A1 | 10/2004 | Ode et al. | |
| 2004/0240585 A1 | 12/2004 | Bishop et al. | |
| 2005/0059360 A1 | 3/2005 | Kenington | |
| 2005/0079834 A1 * | 4/2005 | Maniwa et al. | 455/114.3 |
| 2005/0159117 A1 | 7/2005 | Bausov et al. | |
| 2005/0262498 A1 | 11/2005 | Ferguson et al. | |
| 2006/0012426 A1 | 1/2006 | Nezami | |
| 2006/0012427 A1 | 1/2006 | Nezami | |
| 2006/0141957 A1 | 6/2006 | Fischer et al. | |
| 2006/0214729 A1 | 9/2006 | Furuya et al. | |
| 2006/0270366 A1 | 11/2006 | Rozenblit et al. | |
| 2007/0075780 A1 | 4/2007 | Krvavac et al. | |
| 2007/0171234 A1 | 7/2007 | Crawfis et al. | |
| 2007/0241812 A1 | 10/2007 | Yang et al. | |
| 2007/0264947 A1 | 11/2007 | Rozenblit et al. | |
| 2008/0240286 A1 | 10/2008 | Zhnag et al. | |
| 2009/0013317 A1 | 1/2009 | Abfalter et al. | |
| 2009/0088093 A1 | 4/2009 | Nentwig | |
| 2009/0213972 A1 | 8/2009 | Maunuksela | |
| 2010/0271957 A1 | 10/2010 | Stapleton et al. | |
| 2012/0147993 A1 | 6/2012 | Kim et al. | |
| 2012/0230382 A1 | 9/2012 | Kim et al. | |
| 2013/0214861 A1 | 8/2013 | Kim et al. | |

FOREIGN PATENT DOCUMENTS

| | | |
|---|---|---|
| CN | 1531213 A | 9/2004 |
| CN | 1640086 A | 7/2005 |
| CN | 1288341 A | 6/2006 |
| CN | 1838530 A | 9/2006 |
| CN | 1983801 A | 6/2007 |
| CN | 2012-525093 A | 10/2012 |
| JP | H09-284149 | 10/1997 |
| JP | 2000-278237 A | 10/2000 |
| JP | 2001-217885 A | 10/2001 |
| JP | 2002-536902 A | 10/2002 |
| JP | 2003-304122 A | 10/2003 |
| JP | 2006-340166 | 12/2006 |
| WO | WO 00/46916 A1 | 8/2000 |
| WO | WO 2004/040870 A1 | 5/2004 |
| WO | WO 2006/025213 A1 | 3/2006 |
| WO | WO 2008/154077 A1 | 12/2008 |

OTHER PUBLICATIONS

Office Action in the counterpart Japanese Application No. 2010-506483, dated Jan. 10, 2012, 2 pages.
Office Action for corresponding Japanese Application No. 2010-506483 dated Oct. 9, 2012, 8 pages.

(56) References Cited

OTHER PUBLICATIONS

Non-Final Office Action for U.S. Appl. No. 12/767,669 mailed on Aug. 4, 2011, 10 pages.
Final Office Action for U.S. Appl. No. 12/767,669 mailed on Jan. 30, 2012, 15 pages.
Non-Final Office Action for U.S. Appl. No. 12/767,669 mailed on Oct. 12, 2012, 17 pages.
Second Office Action for corresponding Chinese Application No. 200880021049.8 dated Dec. 4, 2012, 8 pages.
Office Action in the counterpart Chinese Application No. 200880021049.8 dated Mar. 28, 2012, 10 pages.
Kim, W. J., et al., "*Baseband Derived RF Digital Predistortion*", Electronic Letters, Apr. 13, 2006, vol, 42, No. 8, 2 pages.
English Translation and Office Action for corresponding Japanese Application No. 2010-506483 dated Jan. 10, 2012, 6 pages.
International Search Report and Written Opinion of PCT/US2008/061355 mailed on Aug. 4, 2008, 6 pages.
Office Action for corresponding Chinese Application No. 2010-506483 dated Jun. 4, 2013, 3 pages.
Final Office Action for U.S. Appl. No. 12/767,669 mailed on May 9, 2013, 18 pages.
English Translation and Office Action for corresponding Japanese Application No. 2010-506483 dated Jun. 4, 2013, 6 pages.
English Translation and Third Office Action for corresponding Chinese Application No. 200880021049.8 dated Jun. 20, 2013, 14 pages.
English Translation and Office Action for corresponding Japanese Application No. 2012-507473 dated Feb. 25, 2014, 6 pages.
English Translation and Final Office Action for corresponding Japanese Application No. 2010-506483 dated Jan. 17, 2013, 5 pages.
Extended European Search Report for corresponding European Application No. 08746721.3 mailed on Apr. 9, 2014, 12 pages.
English Translation and Office Action for corresponding Korean Application No. 10-2009-7024361 dated Apr. 29, 2014, 9 pages.

\* cited by examiner

DIGITAL HYBRID MODE POWER AMPLIFIER SYSTEM

RELATED APPLICATIONS

This is a continuation-in-part of U.S. patent application Ser. No. 12/021,241, filed Jan. 28, 2008, entitled Power Amplifier Time-Delay Invariant Predistortion Methods and Apparatus, which in turn is a continuation-in-part of U.S. patent application Ser. No. 11/799,239, filed Apr. 30, 2007, entitled High Efficiency Linearization Power Amplifier For Wireless Communication, which in turn is a continuation-in-part of U.S. patent application Ser. No. 11/262,079, filed Oct. 27, 2005, entitled System and Method for Digital Memorized Predistortion for Wireless Communication, which in turn is a continuation of U.S. patent application Ser. No. 10/137,556, filed May 1, 2002 now U.S. Pat. No. 6,985,704, entitled System and Method for Digital Memorized Predistortion for Wireless Communication, all of which are incorporated herein by reference. This application claims the benefit of U.S. patent application Ser. No. 11/961,969 filed Dec. 20, 2007, entitled A Method for Baseband Predistortion Linearization in Multi-Channel Wideband Communication Systems. This application claims the benefit of U.S. Provisional Patent Application Ser. No. 60/925,603, filed Apr. 23, 2007, and having the same inventors as the present case with the exception of Dali Yang, and also claims the benefit of U.S. Provisional Application Ser. No. 61/041,164, filed Mar. 31, 2008, entitled An Efficient Peak Cancellation Method For Reducing The Peak-To-Average Power Ratio In Wideband Communication Systems, and also claims the benefit of U.S. Provisional Application Ser. No. 61/012,416, filed Dec. 7, 2007, entitled Baseband Derived RF Digital Predistortion, and also claims the benefit of U.S. Provisional Application Ser. No. 60/925,577, filed Apr. 23, 2007, entitled N-Way Doherty Distributed Power Amplifier. Further, this application claims the benefit of U.S. patent application Ser. No. 11/962,025, filed Dec. 20, 2007, entitled Power Amplifier Predistortion Methods and Apparatus, U.S. Provisional Patent Application Ser. No. 60/969,127, filed Aug. 30, 2007, entitled Analog Power Amplifier Predistortion Methods and Apparatus, and U.S. Provisional Patent Application Ser. No. 60/969,131, entitled Power Amplifier Predistortion Methods and Apparatus Using Envelope and Phase Detector. All of the foregoing are incorporated herein by reference.

FIELD OF THE INVENTION

The present invention generally relates to wireless communication systems using complex modulation techniques. More specifically, the present invention relates to power amplifier systems for wireless communications.

BACKGROUND OF THE INVENTION

A wideband mobile communication system using complex modulation techniques, such as wideband code division access (WCDMA) and orthogonal frequency division multiplexing (OFDM), has large peak-to-average power ratio (PAPR) specifications and hence requires highly linear power amplifiers for its RF transmissions. The conventional feed-forward linear power amplifier (FFLPA) has been widely utilized due to its excellent linearity performance in spite of poor power efficiency.

Conventional FFLPAs are mainly based on the principle of error subtraction and power-matching with dedicated hardware circuitries to realize non-linear corrections to PA. These approaches must use an auxiliary PA and complicated hardware circuitries to match exactly the transmitted power-balance, time-delay and errors generated by the main PA. After a perfect matching is obtained, the non-linear distortion errors from the main PA can then be canceled by those distortion errors from the auxiliary PA. Due to the complexities of the nonlinear predistortion circuits, which among other things involve many variables and parameters, FFLPAs require significant fine tuning and other calibration efforts. In addition, such traditional FFLPA schemes are also vulnerable to fluctuating environmental conditions, such as temperature and humidity changes, since perfect alignment of the main PA's signal and that of the auxiliary PA are vital. As a result, traditional predistortion schemes are costly to implement and are limited in their predistortion accuracy and stability in a commercial wireless system environment.

In order to overcome the FFLPA's poor efficiency, digital baseband predistortion (PD) has been demonstrated due to the recent advances in digital signal processing (DSP) technology. In addition, Doherty power amplifiers (DPA) have also been applied to these linearization systems to improve power efficiency. However, there is still a demand for higher performance of the power amplifier such as more linearity and better efficiency with less expensive architecture.

Conventional DSP-based PD schemes utilize digital microprocessors to compute, calculate and correct the PA's nonlinearities: they perform fast tracking and adjustments of signals in the PA system. However, conventional DSP-based PD schemes are challenged by variations of the linearity performance of the amplifier due to the environment changing such as temperature and the asymmetric distortions of the output signal of the PA resulting from memory effects. All these variations and distortions have to be compensated for. Since conventional PD algorithms are based on a wideband feedback signal, they require a power-intensive and expensive high speed analog-to-digital converter (ADC) in order to capture necessary information, if at all possible, for processing. In addition, time-synchronizations are also inevitable in order to capture an error signal between a reference signal and a distorted signal. This time-matching process may result in small synchronization errors which can further affect conventional PD schemes' linearization performance.

Moreover, conventional PD schemes necessitate coded in-phase (I) and quadrature (Q) channel signals in the baseband as the required ideal or reference signals. As a result, conventional PD schemes are often standard or modulation specific and must be closely tailored to each baseband system. Therefore, in order to deploy conventional PD schemes into base-stations, the PD engines must be embedded into the baseband architecture of base-stations. This embedment is a practical implementation challenge since it is frequently inconvenient or impossible to modify the baseband architectures of existing base-stations or base-station designs. Once the PD scheme is set up for a specific base-station design, it is often not reconfigurable and hence not upgradeable to future changes in standards or modulations. Furthermore, since traditional PD approaches require baseband I-Q signal sources to operate, they are inapplicable to certain RF systems that do not possess any baseband I-Q signal sources, such as repeater and indoor signal coverage sub-systems.

SUMMARY OF THE INVENTION

Accordingly, the present invention has been made in view of the above problems, and it is an object of the present invention to provide a high performance and cost effective method of power amplifier systems with high linearity and high efficiency for wideband communication system applications. The present disclosure enables a power amplifier system to be field reconfigurable and support multi-modulation schemes (modulation agnostic), multi-carriers and multi-channels.

To achieve the above objects, according to the present invention, the technique is generally based on the method of adaptive digital predistortion to linearize a power amplifier in the RF domain. Various embodiments of the invention are disclosed. In an embodiment, the combination of crest factor reduction, PD, power efficiency boosting techniques as well as a simple algorithm with spectrum monitoring are utilized within a PA system. In another embodiment, analog quadrature modulator compensation structure is also utilized to enhance performance.

Some embodiments of the present invention are able to monitor the fluctuation of the power amplifier characteristics and to self-adjust by means of a self-adaptation algorithm. One such self-adaptation algorithm presently disclosed is called a multi-directional search (MDS) algorithm, which is implemented in the digital domain.

Applications of the present invention are suitable for use with all wireless base-stations, access points, mobile equipment and wireless terminals, portable wireless devices, and other wireless communication systems such as microwave and satellite communications.

Appendix I is a glossary of terms used herein, including acronyms.

THE FIGURES

Further objects and advantages of the present invention can be more fully understood from the following detailed description taken in conjunction with the accompanying drawings in which.

DETAILED DESCRIPTION OF THE INVENTION

The present invention is a novel RF-in/RF-out PA system that utilizes an adaptive digital predistortion algorithm. The present invention is a hybrid system of digital and analog modules. The interplay of the digital and analog modules of the hybrid system both linearize the spectral regrowth and enhance the power efficiency of the PA while maintaining or increasing the wide bandwidth. The present invention, therefore, achieves higher efficiency and higher linearity for wideband complex modulation carriers.

Figure 1:
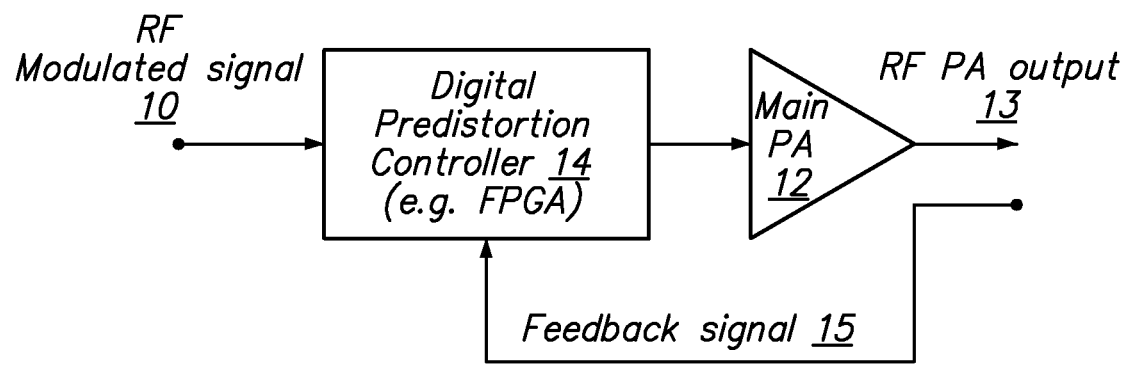
FIG. 1 is a block diagram showing the basic form of a digital hybrid mode power amplifier system.

FIG. 1 is a high level block diagram showing the basic system architecture which can be thought of, at least for some embodiments, as comprising digital and analog modules and a feedback path. The digital module is the digital predistortion controller 14 which comprises the PD algorithm, other auxiliary DSP algorithms, and related digital circuitries. The analog module is the main power amplifier 12, other auxiliary analog circuitries such as DPA, and related peripheral analog circuitries of the overall system. The present invention is a "black box", plug-and-play type system because it accepts RF modulated signal 10 as its input, and provides a substantially identical but amplified RF signal 13 as its output, therefore, it is RF-in/RF-out. The feedback path essentially provides a representation of the output signal to the predistortion controller 14. The present invention is sometimes referred to as a digital hybrid mode power amplifier (DHMPA) system hereinafter.

Figure 2:
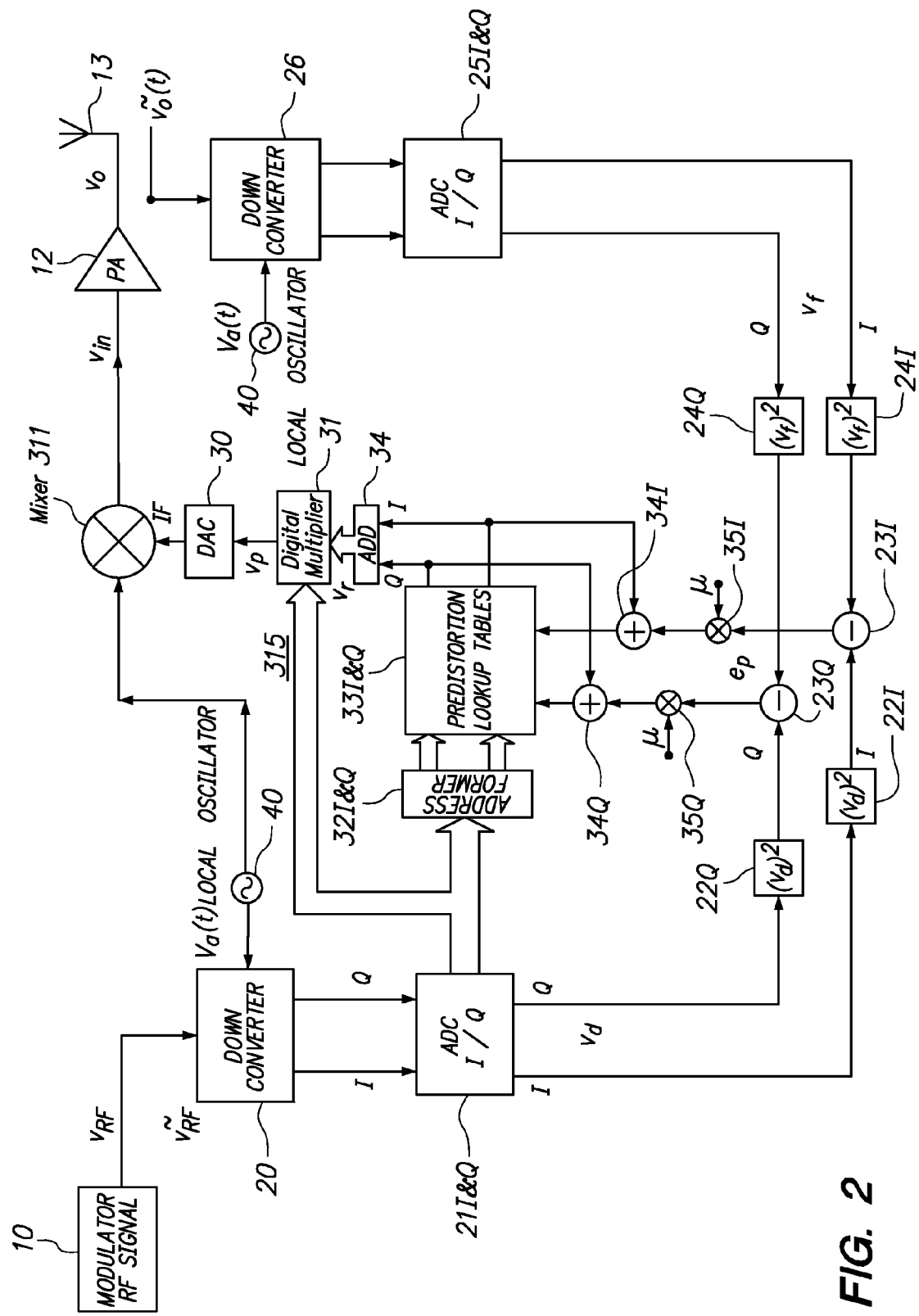
FIG. 2 is a block diagram showing a simple digital hybrid mode power amplifier system according to one embodiment of the present invention.

FIG. 2. is a block diagram showing a simple digital hybrid mode power amplifier system according to one embodiment of the present invention. The embodiment in FIG. 2. is very similar to the architecture disclosed in U.S. patent application Ser. No. 11/799,239, incorporated here in by reference, except that (i) the RF modulated signal 10, $V_{RF}$, only goes through the down converter 20, (ii) a digital multiplier 31 is used in lieu of analog multipliers, and (iii) the predistorted signal, $V_p$, is up-converted to IF band, then converted into an analog IF signal by DAC 30, and finally modulated into $V_{in}$ RF signal by mixer 311 before being provided as an input to PA 12 for wireless transmission.

FIGS. 5-9 are block diagrams showing more sophisticated embodiments of DHMPA system, where like elements are indicated with like numerals. The five embodiments of FIGS. 5-9 apply crest factor reduction (CFR) prior to the PD with an adaptation algorithm in one digital processor, so as to reduce the PAPR, EVM and ACPR and compensate the memory effects and variation of the linearity due to the temperature changing of the PA. The digital processor can take nearly any form; for convenience, an FPGA implementation is shown as an example, but a general purpose processor is also acceptable in many embodiments. The CFR implemented in the digital module of the embodiments is based on the scaled iterative pulse cancellation presented in patent application US61/041,164, filed Mar. 31, 2008, entitled An Efficient Peak Cancellation Method For Reducing The Peak-To-Average Power Ratio In Wideband Communication Systems, incorporated herein by reference. The CFR is included to enhance performance and hence optional. The CFR can be removed from the embodiments without affecting the overall functionality.

Figure 5:
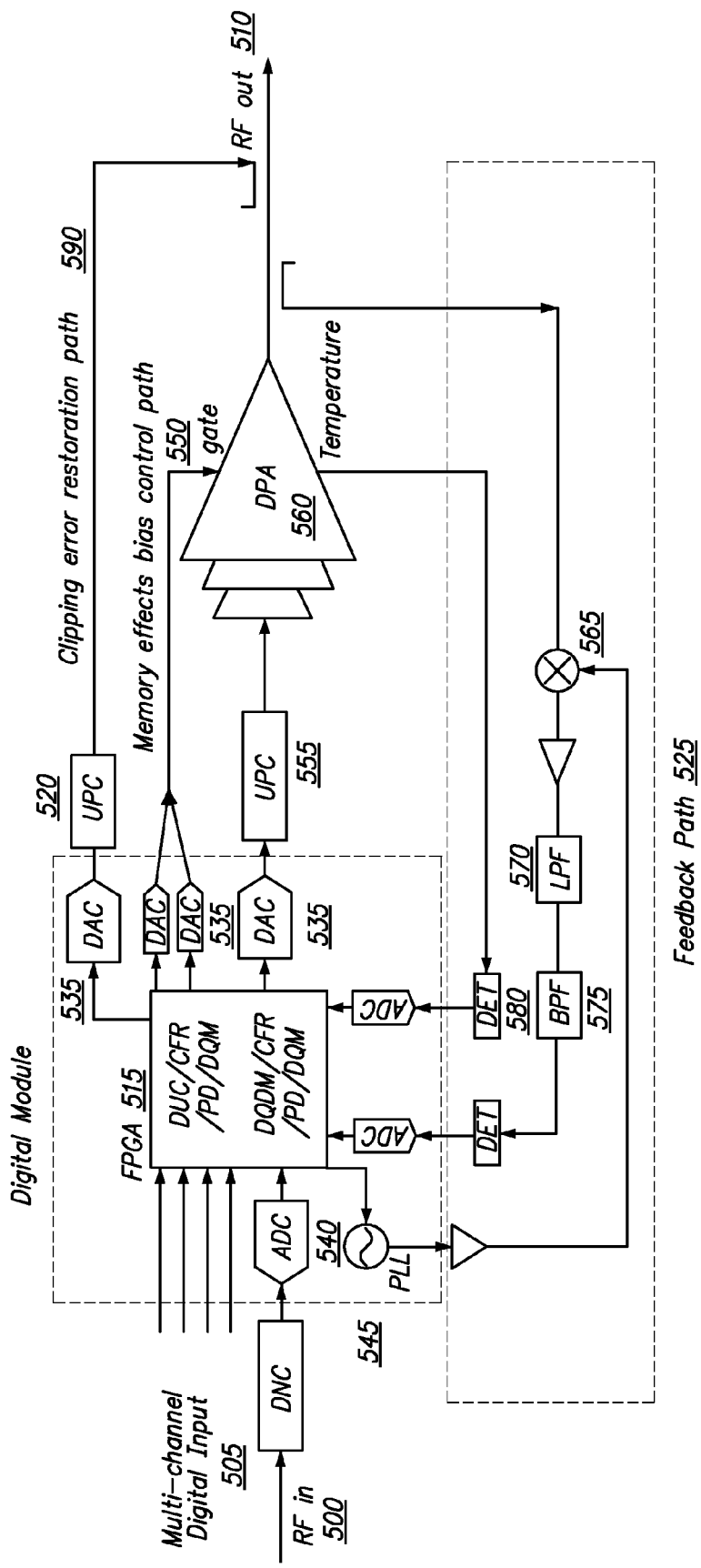
FIG. 5 is a block diagram showing a digital hybrid mode power amplifier system implemented with optional or alternative multi-channel digital input, DQM and UPC-based clipping restoration path according to another embodiment of the present invention.

FIG. 5 is a block diagram showing a DHMPA system according to one embodiment of the present invention (the "FIG. 5. System"). The FIG. 5. System has a dual mode of RF 500 and/or multi-carrier digital signal 505 at the input, and an RF signal at the output 510. The dual mode of signal input allows maximum flexibility: RF-in (the "RF-in Mode") or baseband digital-in (the "Baseband-in Mode"). The FIG. 5. System comprises three key portions: a reconfigurable digital (hereinafter referred as "FPGA-based Digital") module 515, a power amplifier module 520 and a feedback path 525.

The FPGA-based Digital part comprises a digital processor 530 (e.g. FPGA), digital-to-analog converters 535 (DACs), analog-to-digital converters 540 (ADCs), and a phase-locked loop (PLL) 545. Since the FIG. 5 System has a dual input mode, the digital processor has two paths of signal processing. For the RF signal input path, the digital processor has implemented a digital quadrature demodulator (DQDM), a CFR, a PD, and a digital quadrature modulator (DQM). For the baseband digital input path, a digital up-converter (DUC), CFR, PD, and a DQM are implemented.

Figure 7:
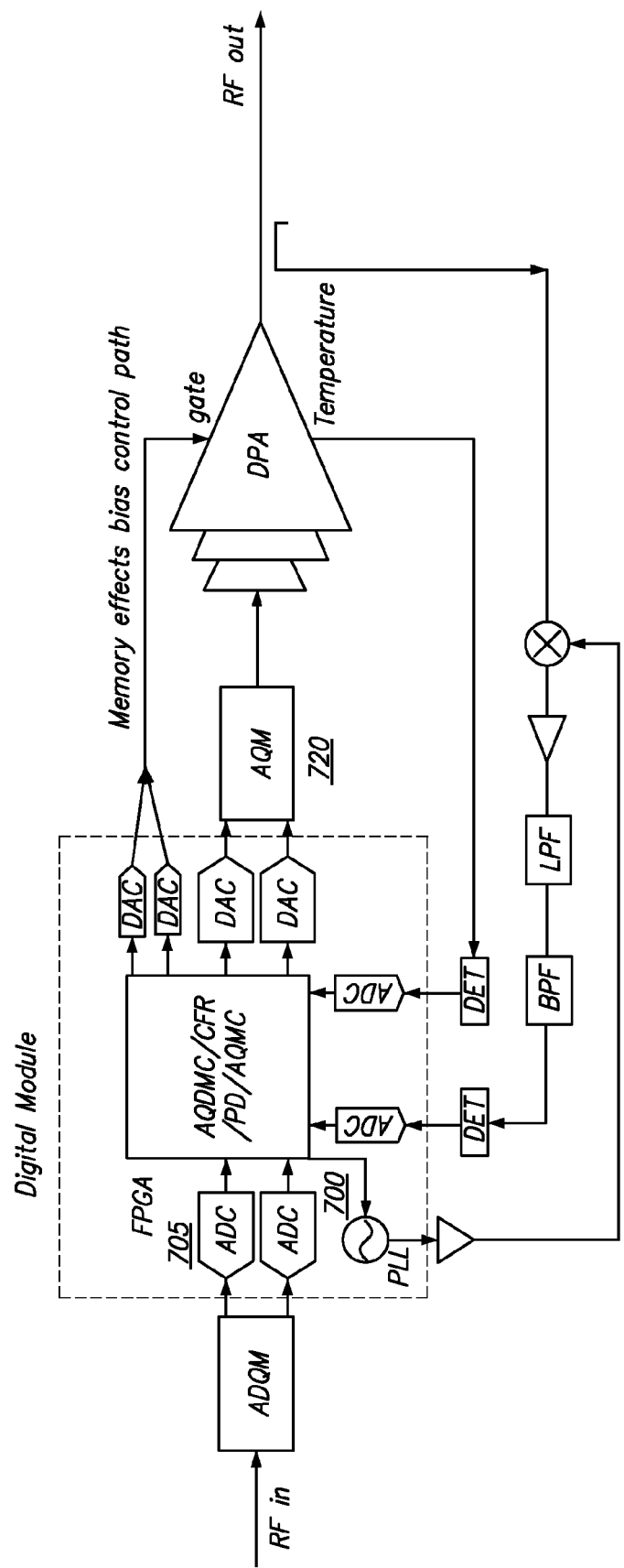
FIG. 7 is a block diagram showing a digital hybrid mode power amplifier system implemented with AQM according to another embodiment of the present invention.
Figure 9:
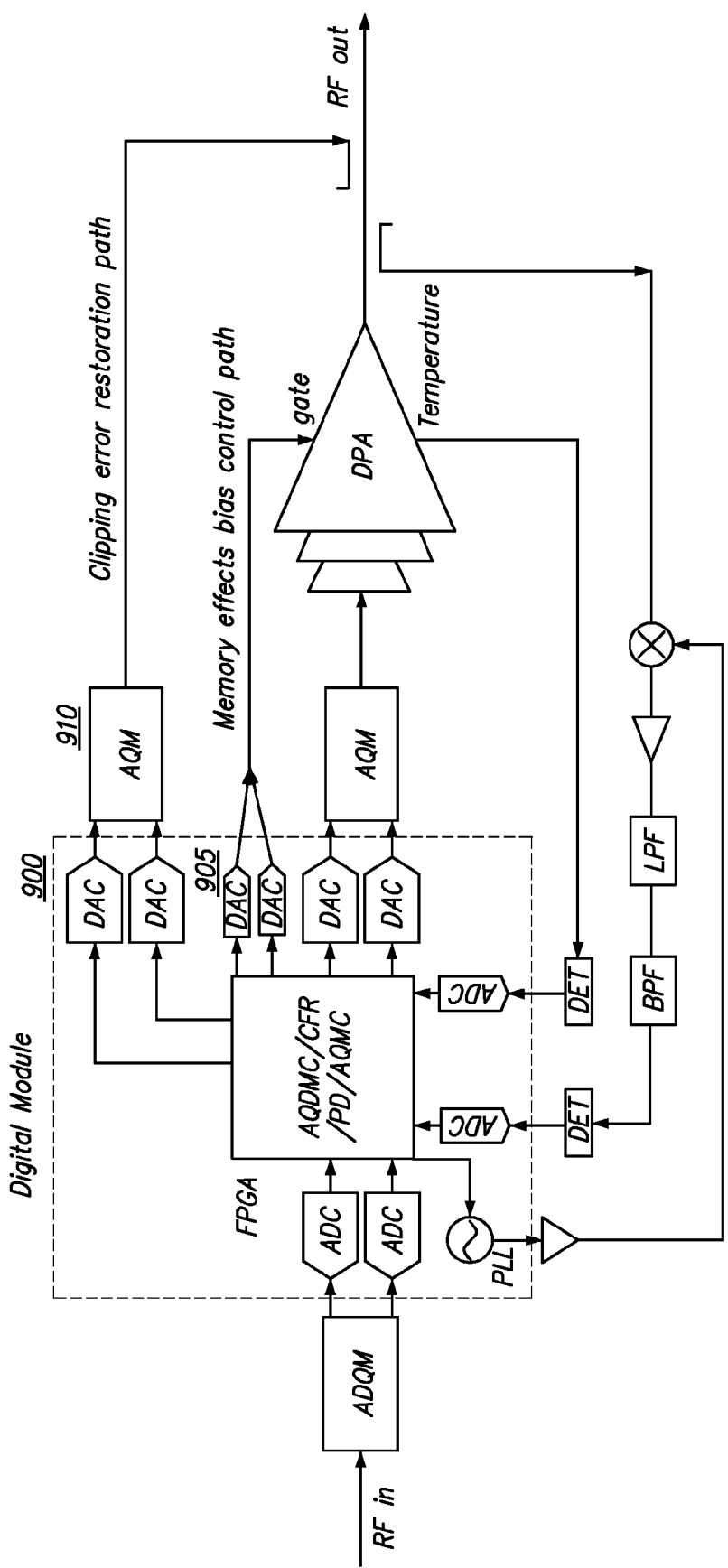
FIG. 9 is a block diagram showing a digital hybrid mode power amplifier system implemented with AQM and AQM-based clipping error restoration path according to another embodiment of the present invention.

The RF-in Mode of the FIG. 5. System has implemented a down converter (DNC) 550 prior to the FPGA-based Digital part and an ADC 540 prior to the FPGA. An analog down converted signal is provided to the FPGA-based Digital module and converted to a digital signal by the ADC 540. The digitally converted signal is demodulated by the DQDM to generate both real and imaginary signals and then PAPR of the signal is reduced by CFR. The peak reduced signal is predistorted to linearize the amplifier and is passed through a DQM to generate the real signal and then converted to an intermediate frequency (IF) analog signal by a DAC in the FPGA-based Digital part. However, it is not required in all embodiments to implement DQDM and DQM in the FPGA. If, as shown in FIGS. 7 and 9, a modulator and demodulator will not be used, then two ADC's 700 and 705 prior to the FPGA and two DAC's 710 and 715 behind the FPGA feeding AQM module 720 can be used to generate real and imaginary signals, respectively (the "AQM Implementation"). The embodiment of FIG. 9 differs from the embodiment of FIG. 7 by virtue of the addition of a clipping error restoration path, indicated by DAC's 900 and 905 together with second AQM logic 910, which feeds to the RF out signal in a manner similar to that shown in FIG. 5.

The Baseband-in Mode of FIG. 5. works slightly different from the RF-in Mode. Digital data streams from multi-channels as I-Q signals are coming to the FPGA-based Digital module and are digitally up-converted to digital IF signals by the DUC. From this point onwards, the Baseband-in Mode and RF-in Mode proceeds identically. These IF signals are then passed through the CFR block so as to reduce the signal's PAPR. This PAPR suppressed signal is digitally predistorted in order to pre-compensate for nonlinear distortions of the power amplifier.

In either input mode, the memory effects due to self-heating, bias networks, and frequency dependencies of the active device are compensated by the adaptation algorithm in the PD, as well. The coefficients of the PD are adapted by a narrowband feedback using a simple power detector in the feedback part as opposed to prior art predistortion techniques that use wideband feedback which requires a very high speed ADC. The predistorted signal is passed through a DQM in order to generate the real signal and then converted to an IF analog signal by the DAC 535 as shown. As disclosed above, the DQM is not required to be implemented in the FPGA, or at all, in all embodiments. If the DQM is not used in the FPGA, then the AQM Implementation can be implemented with two DACs to generate real and imaginary signals, respectively. The gate bias voltage 550 of the power amplifier is determined by the adaptation algorithm and then adjusted through the DACs 535 in order to stabilize the linearity fluctuations due to the temperature changes in the power amplifier. The PLL sweeps the local oscillation signal for the feedback part in order to, first, find the channel locations and then detect the adjacent channel power level or the adjacent channel power ratio (ACPR).

The power amplifier part comprises a UPC for a real signal (such as illustrated in the embodiments shown in FIGS. 5, 6, and 8), or an AQM for real and complex signals (such as depicted in the embodiments shown in FIGS. 7 and 9) from the FPGA-based Digital module, a high power amplifier with multi-stage drive amplifiers, and a temperature sensor. The predistorted baseband signals are up-converted by the UPC 555 and then amplified by the PA 560. In order to improve the efficiency performance of the DHMPA system, efficiency boosting techniques such as Doherty, Envelope Elimination and Restoration (EER), Envelope Tracking (ET), Envelope Following (EF), and Linear amplification using Nonlinear Components (LINC) can be used, depending upon the embodiment. These power efficiency techniques can be mixed and matched and are optional features to the fundamental DHMPA system. One such Doherty power amplifier technique is presented in commonly assigned U.S. Provisional Patent Application US60/925,577, filed Apr. 23, 2007, entitled N-Way Doherty Distributed Power Amplifier, incorporated herein by reference. To stabilize the linearity performance of the amplifier, the temperature of the amplifier is monitored by the temperature sensor and then the gate bias of the amplifier is controlled by the FPGA-based Digital part.

The feedback portion comprises a directional coupler, a mixer, a low pass filter (LPF), gain amplifiers and, a band pass filter (BPF), detectors (DETs). Depending upon the embodiment, these analog components can be mixed and matched with other analog components. Part of the RF output signal of the amplifier is sampled by the directional coupler and then down converted to an IF analog signal by the local oscillation signal in the mixer. The IF analog signal is passing through the LPF, the gain amplifier, and the BPF (e.g., surface acoustic wave filter) which can capture different frequency portions of out-of-band distortions. The output of the BPF is provided to the detector and then to the ADCs of the FPGA-based Digital module in order to determine the dynamic parameters of the PD depending on output power levels and asymmetrical distortions due to the memory effects. In addition, temperature is also detected by the DET 580 to calculate the variation of linearity and then adjust gate bias voltage of the PA. More details of the PD algorithm and self-adaptation feedback algorithm can be appreciated from FIG. 3, which shows a polynomial-based predistortion algorithm and from FIG. 4, which shows in flow diagram form as steps 401 through 410 a multi-directional search algorithm which can be used in some embodiments of the invention.

In the case of a strict EVM requirement for broadband wireless access such as WiMAX or other OFDM based schemes (EVM<2.5%), the CFR in the FPGA-based Digital part is only able to achieve a small reduction of the PAPR in order to meet the strict EVM specification. In general circumstances, this means the CFR's power efficiency enhancement capability is limited. In some embodiments of the present invention, a novel technique is included to compensate the in-band distortions from CFR by use of a "Clipping Error Restoration Path" 590, hence maximizing the DHMPA system power efficiency in those strict EVM environments. As noted above, the Clipping Error Restoration Path has an additional DAC 520 in the FPGA-based Digital portion and an extra UPC in the power amplifier part (see FIGS. 5. & 8). The Clipping Error Restoration Path can allow compensation of in-band distortions resulting from the CFR at the output of the power amplifier. Further, any delay mismatch between the main path and the Clipping Error Restoration Path can be aligned using digital delay in the FPGA.

Figure 6:
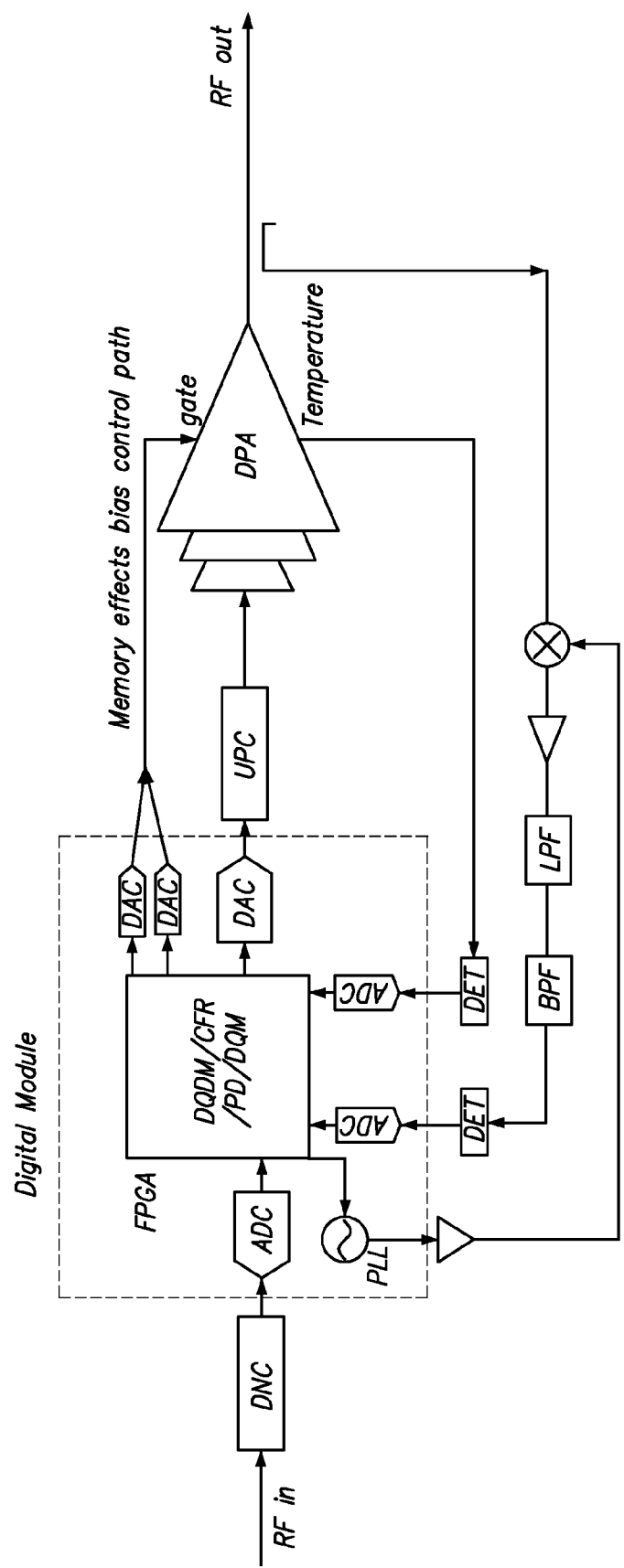
FIG. 6 is a block diagram showing a digital hybrid mode power amplifier system implemented with DQM according to another embodiment of the present invention.

FIG. 6. is a block diagram showing a DHMPA system implemented with DQM according to another embodiment of the present invention (the "FIG. 6 System"). It is identical to FIG. 5 System except that it does not have the Baseband-in Mode and the Clipping Error Restoration Path.

FIG. 7. is a block diagram showing a DHMPA system implemented with AQM according to another embodiment of the present invention (the "FIG. 7 System"). FIG. 7 System is similar to FIG. 6 System except that it has the AQM Implementation option discussed earlier. In addition, the digital processor of FIG. 7 System has implemented an analog quadrature demodulator corrector (AQDMC), a CFR, a PD, and an analog quadrature modulator corrector (AQMC).

In FIG. 7 System, the RF input signal is first down-converted to baseband digital signals, and then digitally up-converted to digital IF signals (−7.5 MHz, −2.5 MHz, 2.5 MHz, 7.5 MHz). If FIG. 7 System has a Baseband-in Mode, then the digital data streams from multi-channels would be digitally up-converted to digital IF signals (−7.5 MHz, −2.5 MHz, 2.5 MHz, 7.5 MHz) directly as they enter the digital processor. The CFR would then reduce the PAPR. The peak reduced signal is predistorted to linearize the DPA and is passing through two DACs for real and imaginary signals and finally through an AQM.

Figure 10:
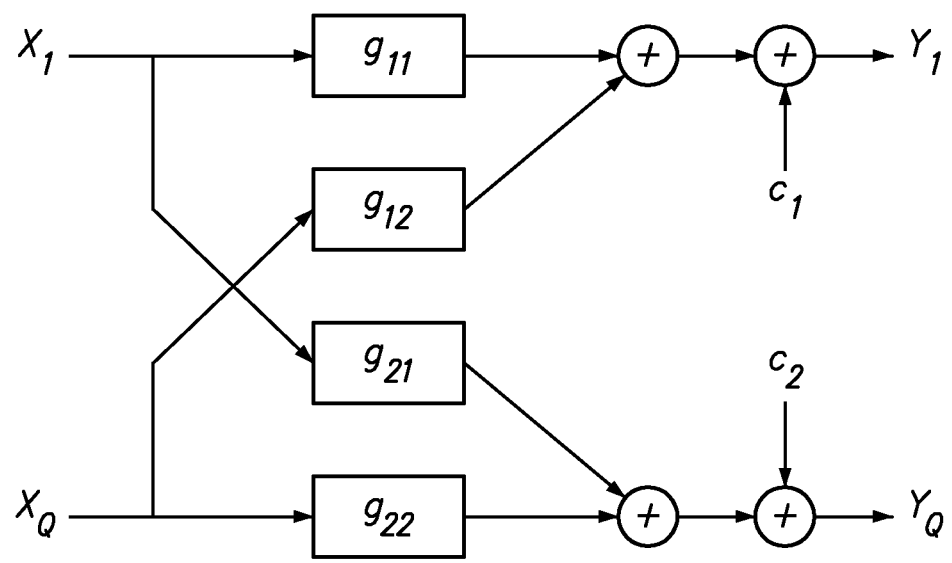
FIG. 10 is a block diagram showing the analog quadrature modulator compensation structure.

FIG. 10. is a block diagram showing the analog quadrature modulator compensation structure. The input signal is separated input an in-phase component $X_I$ and a quadrature component $X_Q$. The analog quadrature modulator compensation structure comprises four real filters {g11, g12, g21, g22} and two DC offset compensation parameters c1, c2. The DC offsets in the AQM will be compensated by the parameters c1, c2. The frequency dependence of the AQM will be compensated by the filters {g11, g12, g21, g22}. The order of the real filters is dependent on the level of compensation required. The output signals $Y_I$ and $Y_Q$ will be presented to the AQM's in-phase and quadrature ports.

The configuration of the power amplifier part and the feedback part of FIG. 7 System are the same as FIG. 6 System.

Figure 8:
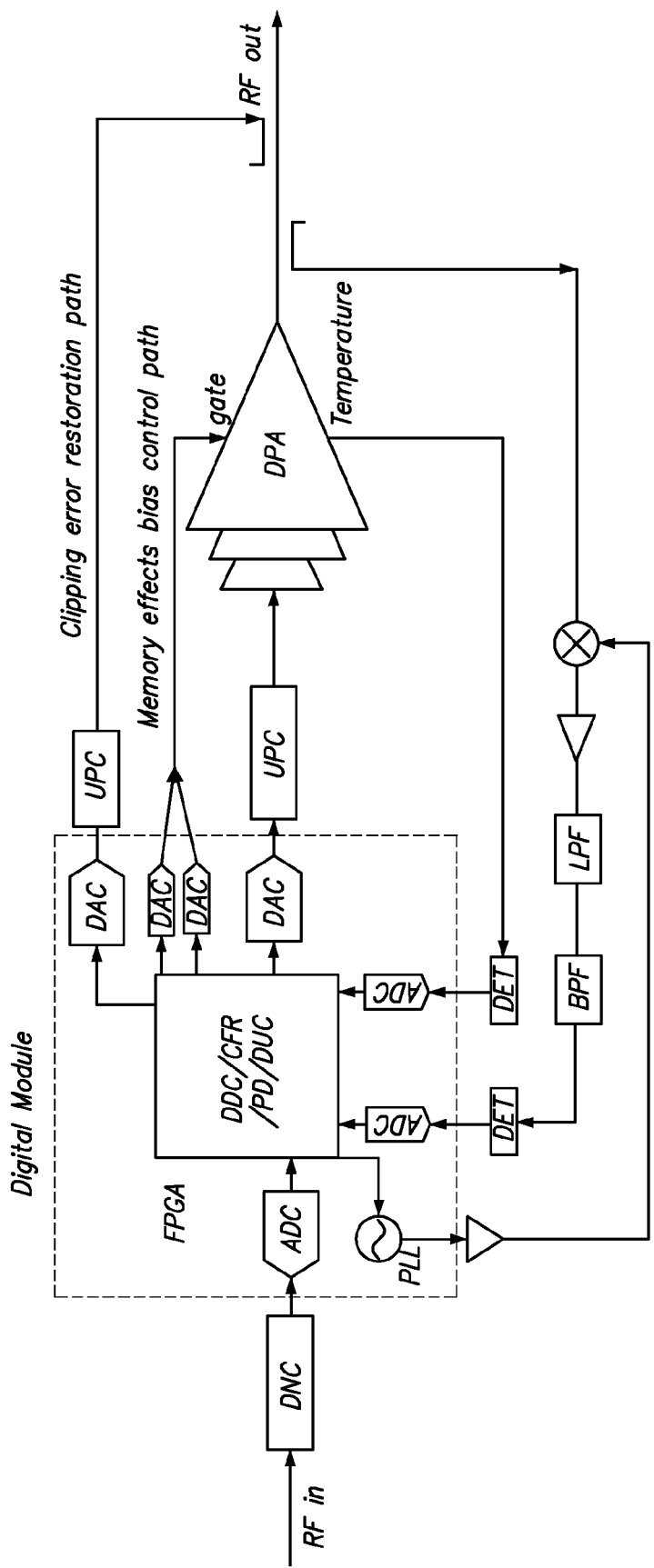
FIG. 8 is a block diagram showing a digital hybrid mode power amplifier system implemented with DUC and UPC-based clipping error restoration path according to another embodiment of the present invention.

FIG. 8. is a block diagram showing a DHMPA system implemented with DUC and the Clipping Error Restoration Path according to another embodiment of the present invention (the "FIG. 8 System"). FIG. 8 System is similar to FIG. 6 System except that it has the Clipping Error Restoration Path. In addition, the digital processor of FIG. 8 System has implemented a digital down converter (DDC), a CFR, a PD, and DUC.

In FIG. 8 System, the DNC frequency translates the RF signal into a low IF signal. The IF signal is then presented to the ADC whereupon it is digitally down-converted to baseband followed by CFR and PD. The output of the PD is a baseband signal which will then be digitally upconverted to an IF frequency and presented to the DAC. The output of the DAC is then further frequency translated to a RF frequency through the UPC. The configuration of the power amplifier part and the feedback part of FIG. 8 System are the same as FIG. 5 System.

FIG. 9. is a block diagram showing a DHMPA system implemented with AQM and AQM-based Clipping Error Restoration Path according to another embodiment of the present invention (the "FIG. 9 System"). FIG. 9 System is identical to FIG. 7 System except that FIG. 9 System has the Clipping Error Restoration Path. The Clipping Error Restoration Path in FIG. 9 System has two DACs in the FPGA-based Digital part and an AQM in lieu of the UPC in the power amplifier part (see FIGS. 5. & 8).

Figure 3:
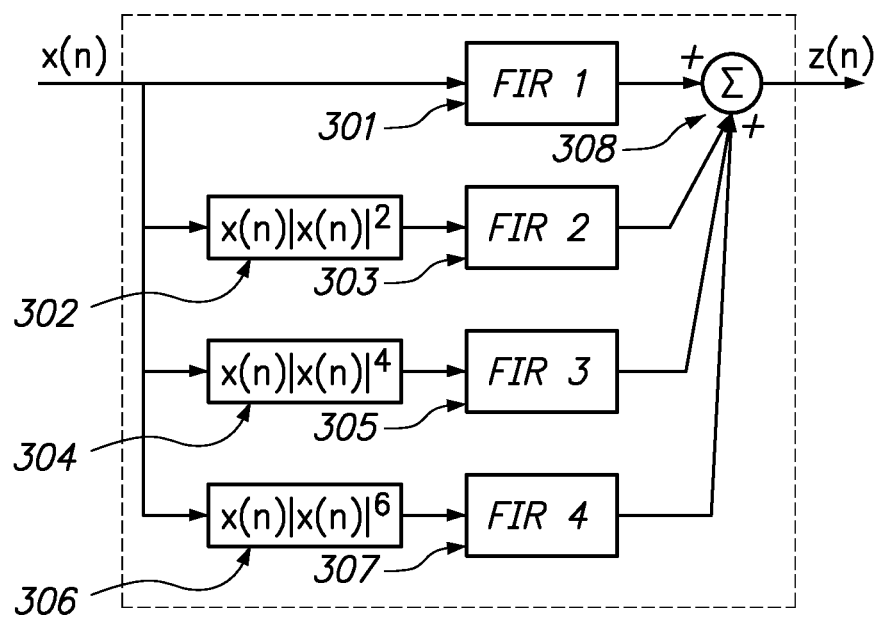
FIG. 3 is a block diagram showing polynomial based predistortion in a digital hybrid mode power amplifier system of the present invention.

FIG. 3. is a block diagram showing a predistortion (PD) part in the DHMPA system of the present invention. The PD in the present invention generally utilizes an adaptive LUT-based digital predistortion system. More specifically, the PD illustrated in FIG. 3 and in embodiments disclosed from FIG. 5 to FIG. 9 are processed in the digital processor by an adaptive algorithm, presented in U.S. patent application Ser. No. 11/961,969, entitled A Method for Baseband Predistortion Linearization in Multi-Channel Wideband Communication Systems. The PD for the DHMPA system in FIG. 3. has multiple finite impulse response (FIR) filters, that is, FIR1 301, FIR2 303, FIR3 305, and FIR4 307. The PD also contains the third order product generation block 302, the fifth order product generation block 304, and the seventh order product generation block 306. The output signals from FIR filters are combined in the summation block 308. Coefficients for multiple FIR filters are updated by the MDS algorithm based on the adjacent channel power level or the ACPR as an evaluation function.

Figure 4:
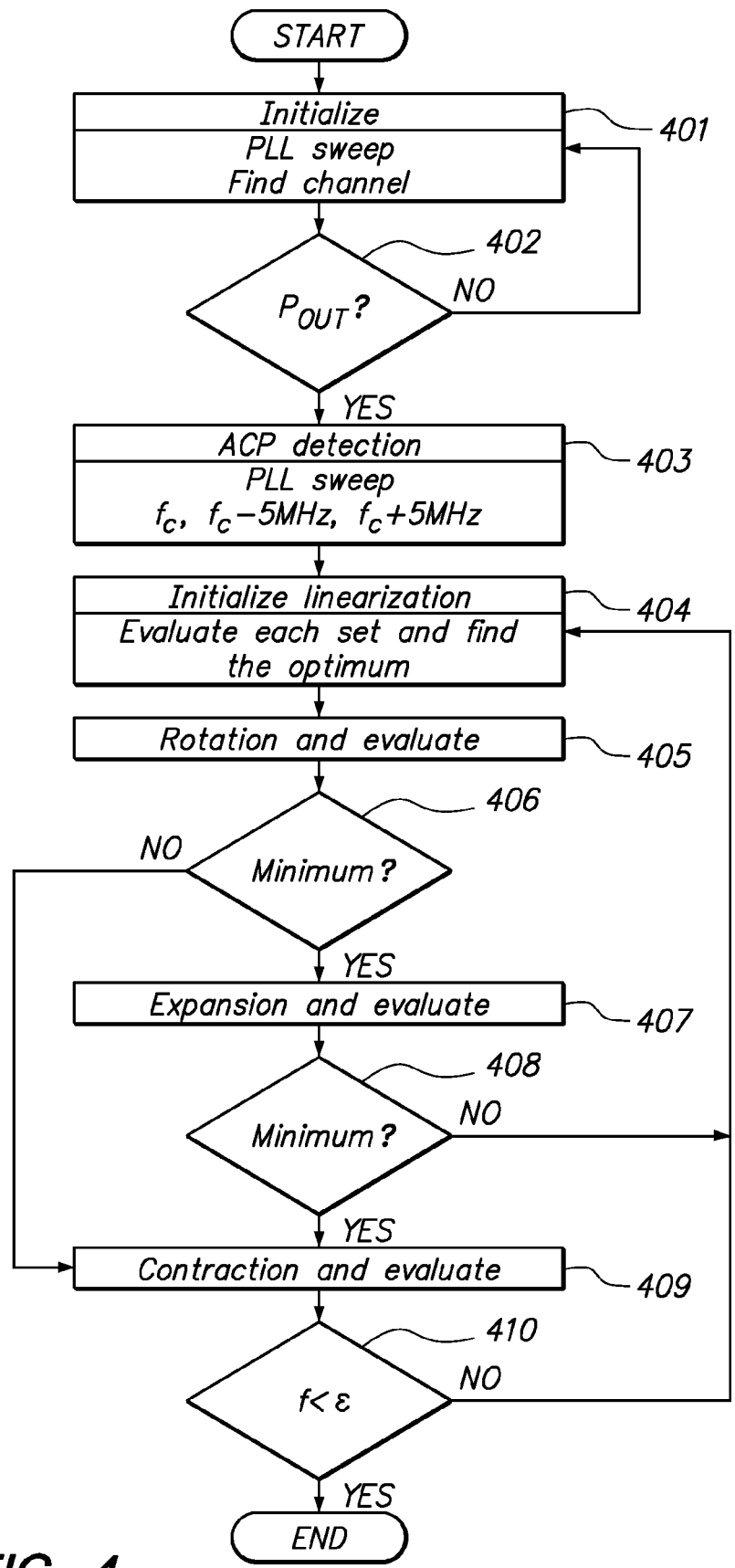
FIG. 4 is a flow chart of the multi-directional search algorithm applied for self-adaptation predistortion in a digital hybrid mode power amplifier system of the present invention.

FIG. 4. is a flow chart of a method for compensating for the PD in the DHMPA system of the present invention. It is the self-adaptation feedback part of the DHMPA system that utilizes the MDS algorithm. Operation of the predistortion compensating apparatus of FIG. 3 may be described with reference to this flow chart.

For purposes of simplicity, but not by way of limitation, WCDMA has been used as an example to illustrate the self-adaptation feedback part and the MDS algorithm. The present invention is by no means limited to WCDMA, since the present invention is standard and modulation agnostic. In WCDMA applications, 12 WCDMA channels are detected first by sweeping PLL in the feedback part (401) in order to search the activated and deactivated channels. Once channel locations are searched (402), the feedback part detects adjacent channel power level or ACPR (especially 5 MHz offset components) again by sweeping PLL (403). Then initialize predistortion and apply the MDS algorithm as follows:

At any iteration k, evaluate each coefficients set, then find the optimum set, $a_0^k$ (404)

Rotation 405: rotate $a_0^k$ and evaluate. If $\min\{f(a_{ri}^k), i=1, \ldots, n\} < f(a_0^k)$ is achieved (406), then go to the Expansion 407; or else go to Contraction 409.

Expansion 407: expand $a_{ri}^k$ and evaluate. If $\min\{f(a_{ei}^k), i=1, \ldots, n\} < \min\{f(a_{ri}^k), i=1, \ldots, n\}$ is achieved (408), then set $a_0^k = a_{ei}^k$; or else set $a_0^k = a_{ri}^k$ and go to (1)

Contraction 409: contract $a_0^k$, evaluate, and set $a_0^k = a_{ci}^k$, then go to (1)

where, a is a vector of coefficients for multiple FIR filters, and f is the evaluation function, which is the adjacent channel power level or the ACPR.

The algorithm stops if the evaluation function is less than the minimum target value (410). This MDS algorithm is elegantly simple to be implemented.

In summary, the DHMPA system of the present invention could enhance the performance for the efficiency and linearity more effectively since the DHMPA system is able to implement CFR, DPD and adaptation algorithm in one digital processor, which subsequently saves hardware resources and processing time. The DHMPA system is also reconfigurable and field-programmable since the algorithms and power efficiency enhancing features can be adjusted like software in the digital processor at anytime.

Furthermore, since the DHMPA system accepts RF modulated signal as input, it is not necessary to use the coded I and Q channel signals in the baseband. Therefore, the performance of wireless base-station systems can be enhanced simply by replacing the existing PA modules with the DHMPA.

The present invention allows a "plug and play" PA system solution such that existing base-station systems do not need to modify their structures and/or rebuild a new set of signal channels in order to benefit from high efficiency and high linearity PA system performance.

Moreover, the DHMPA system is agnostic to modulation schemes such as QPSK, QAM, OFDM, etc. in CDMA, GSM, WCDMA, CDMA2000, and wireless LAN systems. This means that the DHMPA system is capable of supporting multi-modulation schemes, multi-carriers and multi-channels. Other benefits of the DHMPA system includes correction of PA non-linearities in repeater or indoor coverage systems that do not have the necessary baseband signals information readily available.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

APPENDIX I

Glossary of Terms

ACLR Adjacent Channel Leakage Ratio
ACPR Adjacent Channel Power Ratio
ADC Analog to Digital Converter
AQDM Analog Quadrature Demodulator
AQM Analog Quadrature Modulator
AQDMC Analog Quadrature Demodulator Corrector
AQMC Analog Quadrature Modulator Corrector
BPF Bandpass Filter
CDMA Code Division Multiple Access
CFR Crest Factor Reduction
DAC Digital to Analog Converter
DET Detector
DHMPA Digital Hybrid Mode Power Amplifier
DDC Digital Down Converter
DNC Down Converter
DPA Doherty Power Amplifier
DQDM Digital Quadrature Demodulator
DQM Digital Quadrature Modulator
DSP Digital Signal Processing
DUC Digital Up Converter
EER Envelope Elimination and Restoration
EF Envelope Following
ET Envelope Tracking
EVM Error Vector Magnitude
FFLPA Feedforward Linear Power Amplifier
FIR Finite Impulse Response
FPGA Field-Programmable Gate Array
GSM Global System for Mobile communications
I-Q In-phase/Quadrature
IF Intermediate Frequency
LINC Linear Amplification using Nonlinear Components
LO Local Oscillator
LPF Low Pass Filter
MCPA Multi-Carrier Power Amplifier
MDS Multi-Directional Search
OFDM Orthogonal Frequency Division Multiplexing
PA Power Amplifier
PAPR Peak-to-Average Power Ratio
PD Digital Baseband Predistortion
PLL Phase Locked Loop
QAM Quadrature Amplitude Modulation
QPSK Quadrature Phase Shift Keying
RF Radio Frequency
SAW Surface Acoustic Wave Filter
UMTS Universal Mobile Telecommunications System
UPC Up Converter
WCDMA Wideband Code Division Multiple Access
WLAN Wireless Local Area Network

What is claimed is:

1. A digital hybrid mode power amplifier system comprising:
a down-converted RF input;
a multi-channel digital input;
a digital predistortion module for receiving at least one of the down-converted RF input or multi-channel digital input, wherein the digital predistortion module utilizes a predistortion polynomial;
a power amplifier portion responsive to signals representative of an output of the digital predistortion module;
a down-converted feedback portion adapted to monitor signals representative of adjacent channel power for feeding back to the digital predistortion module signals representative of an output of one or more channels of the power amplifier portion, in response to which the digital predistortion module computes the predistortion polynomial and modifies its output to reduce adjacent channel power level; and
wherein the digital predistortion module searches locations of a main channel signal to determine a value representative of adjacent channel power, and implements a multi-directional search algorithm comprising evaluation, rotation, expansion, and contraction using the adjacent channel power value or an adjacent channel power ratio as an evaluation function to develop coefficients for modifying its output.

2. The digital hybrid mode power amplifier system of claim 1 wherein the digital predistortion module comprises at least one of a digital field programmable gate array, digital-to-analog converters, analog-to-digital converters, or a phase-locked loop.

3. The digital hybrid mode power amplifier system of claim 2 wherein:
the power amplifier system is configured for base station applications, and
the digital field programmable gate array comprises at least one of a digital up-converter, a crest factor reduction, a predistorter, or a digital quadrature modulator.

4. The digital hybrid mode power amplifier system of claim 2 wherein:
the power amplifier system is configured for repeater applications, and
the digital field programmable gate array comprises at least one of a digital quadrature demodulator, a crest factor reduction, a predistorter, or a digital quadrature modulator.

5. The digital hybrid mode power amplifier system of claim 2 wherein the digital field programmable gate array provides predistortion that compensates adaptively for both nonlinearity and memory effects of the power amplifier portion by generating asymmetric distortion of a power amplifier.

6. The digital hybrid mode power amplifier system of claim 5 wherein the adaptive compensation for predistortion further comprises:
updating coefficients by detecting adjacent channel powers; and using the adjacent channel power in performing an evaluative function.

7. The digital hybrid mode power amplifier system of claim 2 wherein the digital field programmable gate array comprises an adaptation algorithm to determine an optimum gate bias voltage of a power amplifier for stabilizing linearity fluctuations due to temperature changes of the power amplifier.

8. The digital hybrid mode power amplifier system of claim 1 wherein the power amplifier portion comprises at least one of an up-converter for real signal and an analog quadrature modulator for real and complex signals, a high power amplifier with multi-stage drive amplifiers, or a temperature sensor.

9. The digital hybrid mode power amplifier system of claim 8 wherein the power amplifier portion uses efficiency boosting techniques comprising at least one of Doherty, Envelope Elimination and Restoration, Envelope Tracking, Envelope Following, or Linear amplification using Nonlinear Components.

10. The digital hybrid mode power amplifier system of claim 1 wherein the down-converted feedback portion comprises at least one of a directional coupler, a mixer, a low pass filter, gain amplifiers, a band pass filter, or detectors.

11. The digital hybrid mode power amplifier system of claim 1 wherein in-band distortion resulting from a clipped signal at the output of the power amplifier portion caused by crest factor reduction is compensated by a DAC and UPC responsive to an output of the digital predistortion module.

12. A digital hybrid mode power amplifier system comprising:
   a digital predistortion module for receiving multi-channel digital input, wherein the digital predistortion module utilizes a predistortion polynomial;
   a power amplifier portion responsive to signals representative of an output of the digital predistortion module;
   a down-converted feedback portion adapted to monitor signals representative of adjacent channel power for feeding back to the digital predistortion module signals representative of an output of one or more channels of the power amplifier portion, in response to which the digital predistortion module computes the predistortion polynomial and modifies its output to reduce adjacent channel power level; and
   wherein the digital predistortion module searches locations of a main channel signal to determine a value representative of adjacent channel power, and implements a multi-directional search algorithm comprising evaluation, rotation, expansion, and contraction using the adjacent channel power value or an adjacent channel power ratio as an evaluation function to develop coefficients for modifying its output.

13. The digital hybrid mode power amplifier system of claim 12 wherein the digital predistortion module comprises at least one of a digital field programmable gate array, digital-to-analog converters, analog-to-digital converters, or a phase-locked loop.

14. The digital hybrid mode power amplifier system of claim 13 wherein:
   the power amplifier system is configured for base station applications, and
   the digital field programmable gate array comprises at least one of a digital up-converter, a crest factor reduction, a predistorter, or a digital quadrature modulator.

15. The digital hybrid mode power amplifier system of claim 13 wherein the digital field programmable gate array provides predistortion that compensates adaptively for both nonlinearity and memory effects of the power amplifier portion by generating asymmetric distortion of a power amplifier.

16. The digital hybrid mode power amplifier system of claim 15 wherein the adaptive compensation for predistortion further comprises:
   updating coefficients by detecting adjacent channel powers; and
   using the adjacent channel power in performing an evaluative function.

17. The digital hybrid mode power amplifier system of claim 13 wherein the digital field programmable gate array comprises an adaptation algorithm to determine an optimum gate bias voltage of a power amplifier for stabilizing linearity fluctuations due to temperature changes of the power amplifier.

18. The digital hybrid mode power amplifier system of claim 12 wherein the power amplifier portion comprises at least one of an up-converter for real signal and an analog quadrature modulator for real and complex signals, a high power amplifier with multi-stage drive amplifiers, or a temperature sensor.

19. The digital hybrid mode power amplifier system of claim 18 wherein the power amplifier portion uses efficiency boosting techniques comprising at least one of Doherty, Envelope Elimination and Restoration, Envelope Tracking, Envelope Following, or Linear amplification using Nonlinear Components.

20. The digital hybrid mode power amplifier system of claim 12 wherein the down-converted feedback portion comprises at least one of a directional coupler, a mixer, a low pass filter, gain amplifiers, a band pass filter, or detectors.

21. The digital hybrid mode power amplifier system of claim 12 wherein in-band distortion resulting from a clipped signal at the output of the power amplifier portion caused by crest factor reduction is compensated by a DAC and UPC responsive to an output of the digital predistortion module.

* * * * *